United States Patent
Kaeriyama

(10) Patent No.: US 11,217,989 B2
(45) Date of Patent: Jan. 4, 2022

(54) DRIVE DEVICE, POWER SUPPLY SYSTEM, AND METHOD OF TESTING DRIVE DEVICE

(71) Applicant: RENESAS ELECTRONICS CORPORATION, Tokyo (JP)

(72) Inventor: Shunichi Kaeriyama, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 116 days.

(21) Appl. No.: 16/841,224

(22) Filed: Apr. 6, 2020

(65) Prior Publication Data

US 2020/0343715 A1    Oct. 29, 2020

(30) Foreign Application Priority Data

Apr. 23, 2019  (JP) .............................. JP2019-081679

(51) Int. Cl.
| | | |
|---|---|---|
| *H02H 7/00* | (2006.01) | |
| *H02H 7/12* | (2006.01) | |
| *H02H 1/00* | (2006.01) | |
| *G01R 31/26* | (2020.01) | |

(52) U.S. Cl.
CPC ....... *H02H 7/1213* (2013.01); *G01R 31/2607* (2013.01); *H02H 1/0007* (2013.01)

(58) Field of Classification Search
None
See application file for complete search history.

(56) References Cited

U.S. PATENT DOCUMENTS

| | | | |
|---|---|---|---|
| 5,534,814 A | 7/1996 | Archer | |
| 9,906,143 B1* | 2/2018 | Yu ......................... | H02H 7/1213 |
| 10,270,239 B2* | 4/2019 | Bahl ....................... | H02M 1/32 |
| 10,333,509 B2 | 6/2019 | Kaeriyama | |
| 2019/0123546 A1* | 4/2019 | Wang ..................... | H03K 19/00 |

FOREIGN PATENT DOCUMENTS

JP    2017-229151 A    12/2017

OTHER PUBLICATIONS

L. Dulau et al., "A New Gate Driver Integrated Circuit for IGBT Devices With Advanced Protections", IEEE Transactions on Power Electronics, vol. 21, No. 1, Jan. 2006, pp. 38-44.

* cited by examiner

*Primary Examiner* — Stephen W Jackson
(74) *Attorney, Agent, or Firm* — McDermott Will & Emery LLP

(57) ABSTRACT

A drive device comprises a sensor for detecting a state of stress applied to a power transistor, a threshold voltage setting circuit for outputting a threshold voltage, an anomaly monitor circuit for determining whether or not a state of stress is abnormal by comparing a detected voltage of the sensor with the threshold voltage, and a control circuit for fixing the power transistor to either on or off when the state of stress is determined to be abnormal by the anomaly monitor circuit. When an operating mode is a test mode, the control circuit tests whether the anomaly monitor circuit determines the state of the stress is abnormal or not by switching a level of the threshold voltage set by the threshold voltage setting circuit so as to determine that a state of the stress applied to the power transistor is abnormal in the normally operating anomaly monitor circuit.

19 Claims, 12 Drawing Sheets

FIG. 11

| IN | Vcmp | AMC | ERR2 |
|---|---|---|---|
| H | X | L | L |
| L | L | L | L |
| L | H | H | L |
| L | L | H | H |

DRIVE DEVICE, POWER SUPPLY SYSTEM, AND METHOD OF TESTING DRIVE DEVICE

CROSS-REFERENCE TO RELATED APPLICATIONS

The disclosure of Japanese Patent Application No. 2019-081679 filed on Apr. 23, 2019 including the specification, drawings and abstract is incorporated herein by reference in its entirety.

BACKGROUND

This invention relates to a drive device, a power supply system and a test method of a drive device. For example, a drive device, a power supply system and a test method of a drive device which are suitable for improving security.

Since high voltage and large current are used in a control of inverter mounted on an electric vehicle and a control of a large motor, high safety is required for on/off control of power transistor such as IGBT (Insulated Gate Bipolar Transistor) and MOSFET (Metal-Oxide-Semiconductor Field-Effect Transistor).

For example, if a power transistor is unintentionally turned on when it is to be turned off, an overcurrent flows through the power transistor. Further, when a surge or a back electromotive voltage occurs, an overvoltage is applied to the power transistor.

Further, in the case of a high load, the power transistor is overheated to exceed a rated temperature. Such an overcurrent, overvoltage or overheating condition can cause breakdown or unintentional degradation of the power transistor.

Therefore, a gate driver for driving the power transistor is generally provided with a circuit for detecting an overvoltage, an overcurrent, and an overheat state of the power transistor and protecting the power transistor from the overvoltage, the overcurrent, and the overheat state.

There are disclosed techniques listed below.
[Patent Document 1] Japanese Unexamined Patent Application Publication No. 2017-229151
[Patent Document 2] U.S. Pat. No. 5,534,814 For example, Patent Document 1 discloses a configuration of a gate driver having a function of protecting a power transistor.
[Non Patent Document 1] L. Dulau, et al, "A new gate driver integrated circuit for IGBT devices with advanced protections", IEEE Transactions on Power Electronics, Vol. 21, Issue 1, p. 38-44, 2006.

The Patent Document 2 and the Non Patent Document 1 disclose configurations of active mirror clamp circuits for preventing noises generated in IGBT gate voltages.

SUMMARY

However, in the configuration of the related art, there is no function of testing whether or not the protection circuit such as the overvoltage protection circuit is operating normally. Therefore, there is a problem that the power transistor cannot be protected from excessive stress such as overvoltage when the protection circuit is not operating normally due to, for example, an open failure due to cracking of the solder of the terminal, attachment of dust, or a short circuit due to a failure of a component. That is, in the configuration of the related art, there is a problem that the safety cannot be improved. As a result, the power transistor may be destroyed or unintentionally degraded in the related art configuration.

Other objects and novel features will become apparent from the description of this specification and the accompanying drawings.

According to an embodiment, a drive device comprises a sensor configured to detect and output a state of a stress applied to a power transistor as a detection voltage, a threshold voltage setting circuit configured to output a threshold voltage, an anomaly monitor circuit configured to determine whether the state of the stress applied to the power transistor is abnormal or not by comparing the detection voltage and the threshold voltage, and a control circuit configured to fix the power transistor to on or off according to a type of the stress when the anomaly monitor circuit determines the state of the stress is abnormal. When an operation mode is a test mode, the control circuit is further configured to test whether the anomaly monitor circuit determines the state of the stress is abnormal or not by switching a level of the threshold voltage set by the threshold voltage setting circuit so as to determine that a state of the stress applied to the power transistor is abnormal in the normally operating anomaly monitor circuit.

According to another embodiment, a test method of a drive device comprises switching a level of a threshold voltage set by a threshold voltage setting circuit so as to determine that a state of a stress applied to a power transistor is abnormal in a normally operating anomaly monitor circuit, and testing whether the anomaly monitor circuit determines the state of the stress applied to the power transistor is abnormal by comparing a detected voltage of a sensor for detecting a state of a stress applied to the power transistor with the threshold voltage.

According to the above-mentioned embodiment, it is possible to provide a drive device, a power supplying system, and a test method of a drive device, which can improve safety.

BRIEF DESCRIPTION OF THE DRAWINGS

FIG. 11 is a truth table of an input and an output signals of the gate drive circuit provided in the power supply system shown in FIG. 10.

DETAILED DESCRIPTION

Figure 1:
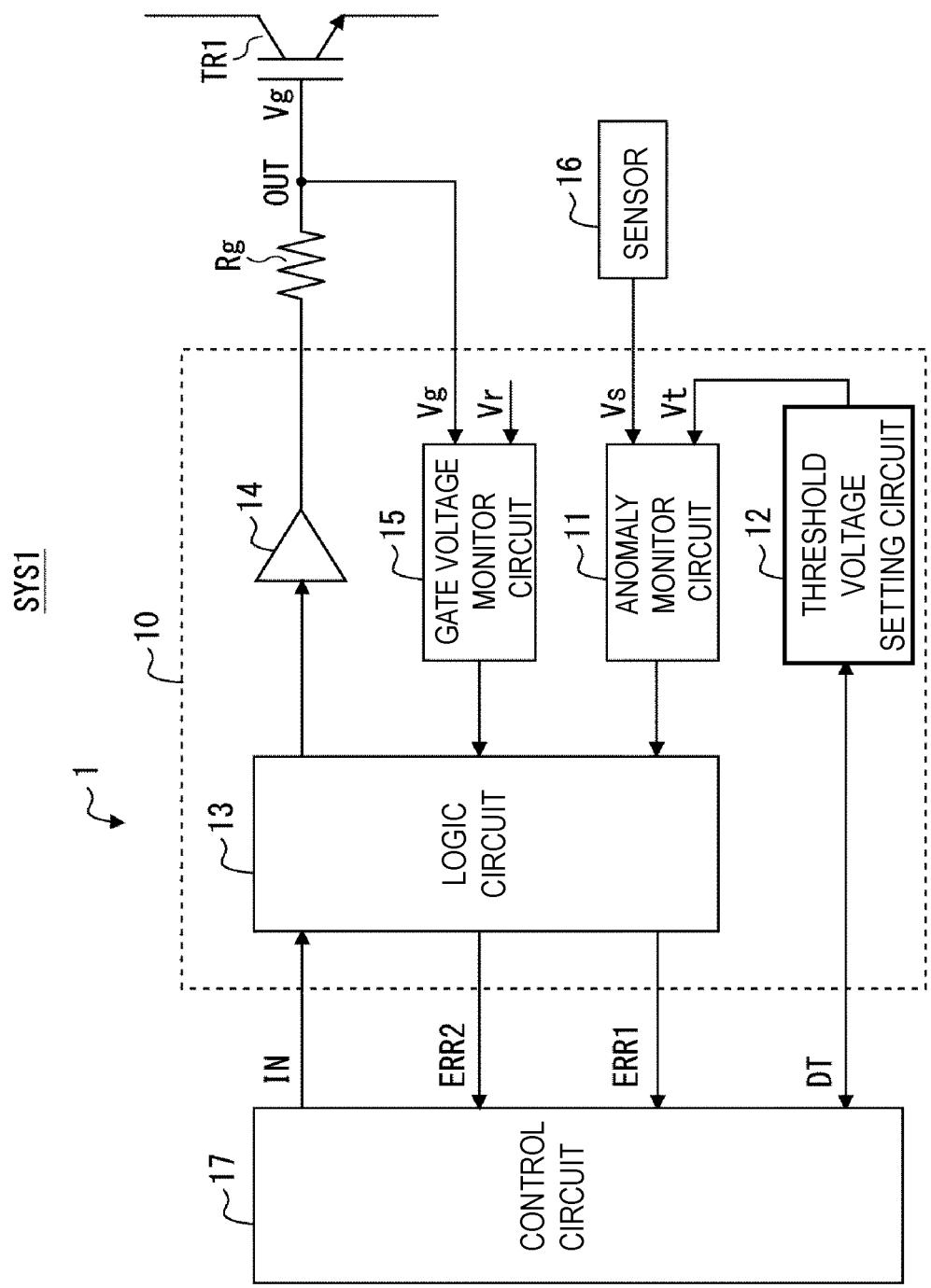
FIG. 1 is a diagram showing a configuration example of a power supplying system according to a first embodiment.

For clarity of explanation, the following description and drawings are appropriately omitted and simplified. In addition, the elements described in the drawings as functional blocks for performing various processes can be configured as CPU (Central Processing Unit), memories, and other circuits in terms of hardware, and are realized by programs loaded into the memories in terms of software. Therefore, it is understood by those skilled in the art that these functional blocks can be realized in various forms by hardware alone, software alone, or a combination thereof, and the present invention is not limited to any of them. In the drawings, the same elements are denoted by the same reference numerals, and a repetitive description thereof is omitted as necessary.

Also, the program described above may be stored and provided to a computer using various types of non-transitory computer readable media. Non-transitory computer readable media includes various types of tangible storage media. Examples of non-transitory computer-readable media include magnetic recording media (e.g., flexible disks, magnetic tapes, hard disk drives), magneto-optical recording media (e.g., magneto-optical disks), CD-ROM (Read Only Memory, a CD-R, a CD-R/W, solid-state memories (e.g., masked ROM, PROM (Programmable ROM), EPROM (Erasable PROM, flash ROM, RAM (Random Access Memory)). The program may also be supplied to the computer by various types of transitory computer-readable media. Examples of transitory computer-readable media include electrical signals, optical signals, and electromagnetic waves. The transitory computer readable medium may provide the program to the computer via wired or wireless communication paths, such as electrical wires and optical fibers.

First Embodiment

FIG. 1 is a diagram showing a configuration example of a power supply system SYS1 according to the first embodiment. The power supply system SYS1 of the present embodiment is used, for example, in inverter or the like for driving motor.

The power supplying system SYS1 according to the present embodiment includes an abnormality monitor circuit for monitoring a state of a stress applied to a power transistor TR1, and has a function of testing whether or not the anomaly monitor circuit operates normally. Accordingly, the power supply system SYS1 according to the present embodiment can monitor the state of the stress applied to the power transistor TR1 by using a highly reliable anomaly monitor circuit, so that the safety of the power supply system SYS1 can be improved. Hereafter, a concrete description will be given.

As shown in FIG. 1, the power supply system SYS1 includes the power transistor TR1 and a drive device 1 for driving the power transistor TR1.

The power transistor TR1 is a IGBT, a MOSFET, or the like, and switches whether or not electric power is supplied to load such as a motor. In the present embodiment, the power transistor TR1 is an IGBT.

The drive device 1 includes at least a gate drive circuit 10, a sensor 16, a control circuit 17, and a resistor Rg.

The sensor 16 detects a state of the stress applied to the power transistor TR1 and outputs the detected voltage Vs. The stress applied to the power transistor TR1 includes, for example, a voltage applied to the power transistor TR1, a current flowing through the power transistor TR1, and a temperature of the power transistor TR1.

The gate drive circuit 10 controls a gate voltage Vg of the power transistor TR1 based on an instruction from the control circuit 17. Specifically, the gate drive circuit 10 includes an anomaly monitor circuit 11, a threshold voltage setting circuit 12, a buffer 14, a gate voltage monitor circuit 15, and a logic circuit 13. These components provided in the gate drive circuit 10 are formed on the same chip, for example.

A logic circuit 13 generates a control signal OUT in accordance with a control signal IN from the control circuit 17. The buffer 14 drives and outputs the control signal OUT. The control signal OUT outputted from the buffer 14 are applied to the gate of the power transistor TR1 through the resistor Rg. As a result, the power transistor TR1 is switched on and off.

The anomaly monitor circuit 11 monitors whether or not the state of the stress applied to the power transistor TR1 is abnormal based on the result detected by the sensor 16. Specifically, the anomaly monitor circuit 11 compares the detection voltage Vs output from the sensor 16 with a threshold voltage Vt set in the threshold voltage setting circuit 12, and outputs the comparison result as a monitoring result.

For example, when the detected voltage Vs is within the allowable voltage defined by the threshold voltage Vt, the anomaly monitor circuit 11 outputs a monitoring result indicating that the stress applied to the power transistor TR1 is normal. On the other hand, when the detected voltage Vs is outside the allowable voltage defined by the threshold voltage Vt, the anomaly monitor circuit 11 outputs a monitoring result indicating that the stress applied to the power transistor TR1 is abnormal.

The logic circuit 13, upon receiving the monitoring result indicating that the state of the stress applied to the power transistor TR1 from the anomaly monitor circuit 11 is abnormal, to activate the error signal ERR1 (e.g., H level). When the control circuit 17 receives the error signal ERR1 of the active state, the control circuit 17 instructs the gate drive circuit 10 to fix the power transistor TR1 to either on or off depending on the type of stress (either voltage, current and heat). The gate drive circuit 10 fixes the power transistor TR1 on or off based on an instruction from the control circuit 17. As a result, the excessive stress applied to the power transistor TR1 is eliminated, so that breakage and unintentional degradation of the power transistor TR1 are suppressed.

The gate voltage monitor 15 monitors the gate voltage Vg of the power transistor TR1. Specifically, the gate voltage monitor circuit 15 compares the gate voltage Vg with a reference voltage Vr to monitor whether or not the gate voltage Vg indicates a desired voltage level.

The logic circuit 13 compares the result of monitoring by the gate voltage monitor circuit 15 with the control signal IN output from the control circuit 17. When the result of monitoring by the gate voltage monitor circuit 15 differs from the control signal IN outputted from the control circuit 17, the logic circuit 13 activates the error signal ERR2, e.g., sets the error signal to H-level. The control circuit 17, upon receiving the error signal ERR2 of the active state, for example, stops the operation of the gate drive circuit 10 or notify an user that the power transistor TR1 is not operating properly.

Here, the gate voltage monitor circuit 15 directly monitors the gate voltage Vg of the power transistor TR1. Thus, unlike the case where the gate voltage Vg is indirectly monitored from the internal signal of the gate drive circuit 10, the gate voltage monitor circuit 15 can detect that the gate voltage Vg does not exhibit a desired voltage level due to, for example, an open fault or a short-circuit fault occurring in either the terminal of the chip or a component outside the chip.

Further, the control circuit 17 has a function of testing whether or not each of the anomaly monitor circuit 11 and the gate voltage monitor circuit 15 normally operates, for example, at the time of system start-up before the system enters normal operation, during idling, or at the time of shutdown after the system finishes normal operation.

Figure 2:
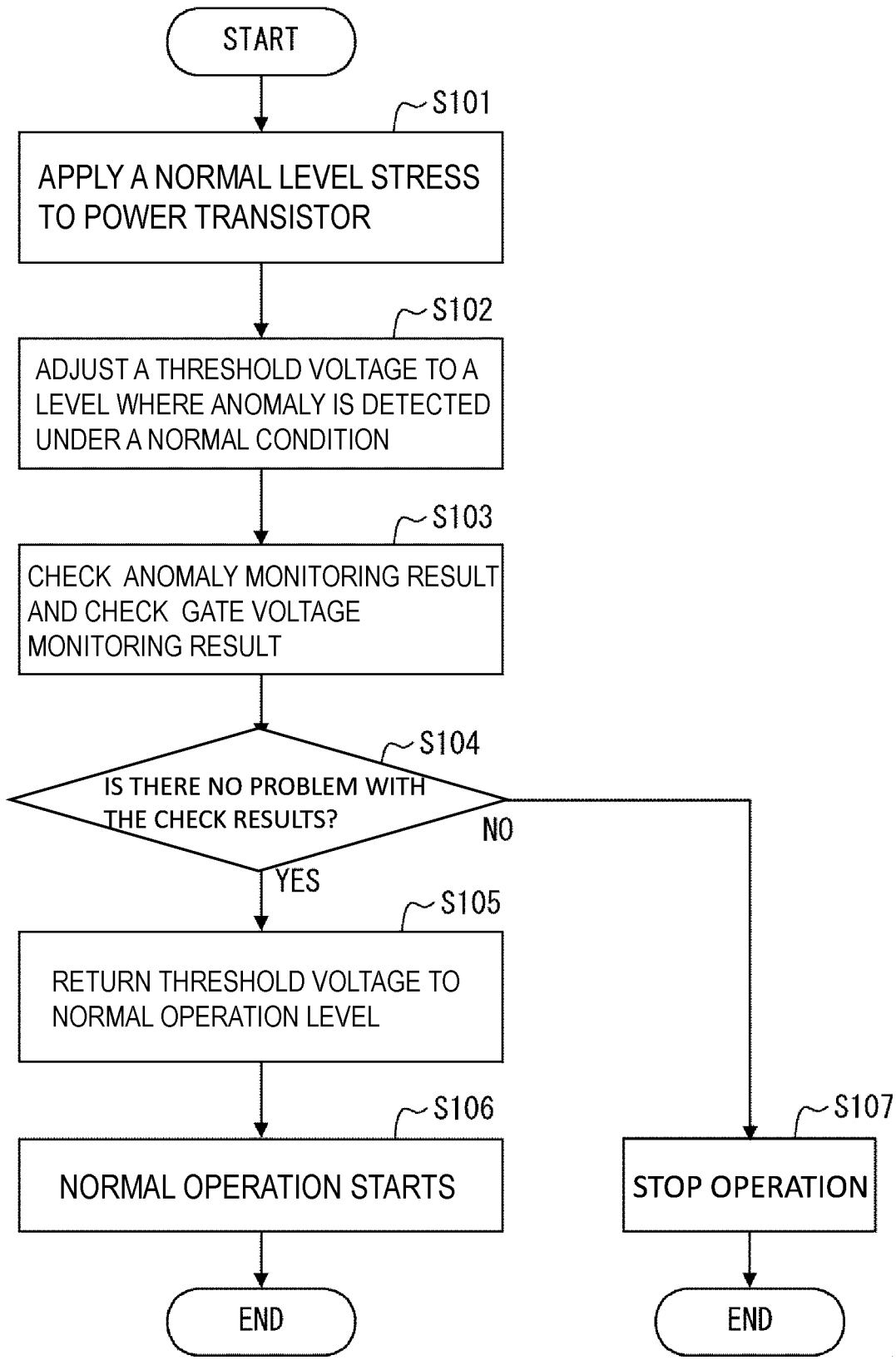
FIG. 2 is a flowchart showing a test operation of a gate drive circuit provided in the power supply system shown in FIG. 1.
Figure 3:
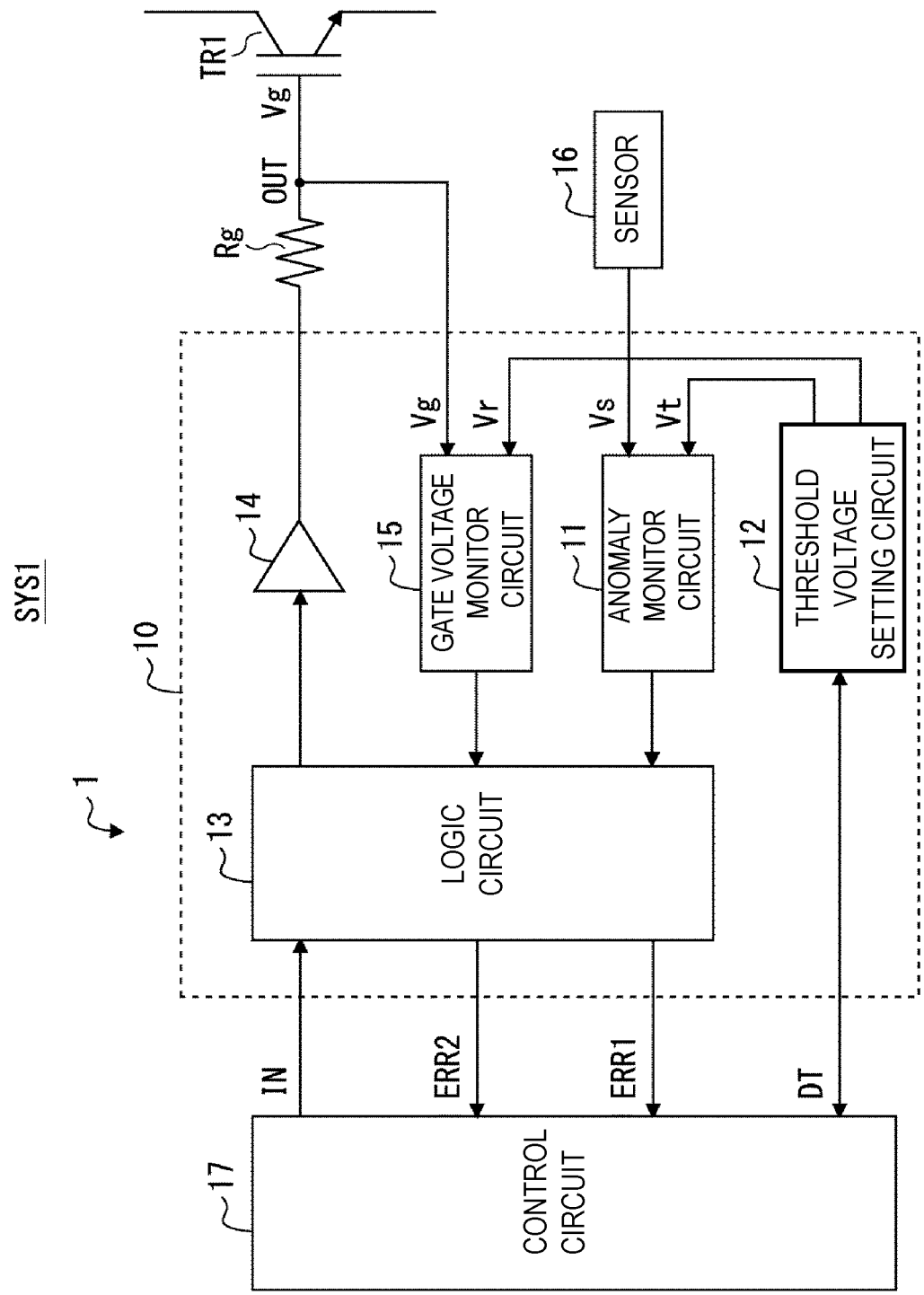
FIG. 3 is a diagram illustrating a modified example of the power delivery system shown in FIG. 1.

(Test operation of the gate drive circuit 10) Subsequently, with reference to FIG. 2, the test operation of the gate drive circuit 10 provided in the power supply system SYS1 will be described. FIG. 2 is a flow chart showing the operation of testing the gate-driving circuits 10 provided in the power-supply-system SYS1. In the following, the operation mode in which a normal operation is performed is referred to as a normal operation mode, the operation mode in which a test whether the abnormal monitoring circuit 11 and the gate voltage monitor circuit 15 normally operates is performed is referred to as a test mode.

First, in the test mode, a normal-level stress in the normal operation mode is applied to the power transistor TR1 (step S101).

Thereafter, the control circuit 17 switches a level of the threshold voltage Vt set by the threshold voltage setting circuit 12 so that the detection voltage Vs is outside the range of the allowable voltage defined by the threshold voltage Vt. In other words, the control circuit 17 switches the level of the threshold voltage Vt, which is set by the threshold voltage setting circuit 12, so as to determine that the state of the stress applied to the power transistor TR1 is abnormal in the case of the anomaly monitor circuit 11 operating normally (step S102).

Thereafter, the control circuit 17 checks the monitoring results of the anomaly monitor circuit 11 and the gate voltage monitor circuit 15, respectively (step S103).

At this time, the anomaly monitor circuit 11 outputs a monitoring result indicating that the state of the stress applied to the power transistor TR1 is abnormal if the state is normal, and outputs a monitoring result opposite to the state of the stress applied to the power transistor TR1 if the state is not normal. The logic circuit 13, upon receiving the monitoring result indicating that the state of the stress applied to the power transistor TR1 from the anomaly monitor circuit 11 is abnormal, to activate the error signal ERR1 (e.g., H level). The control circuit 17 receives the active-state error signal ERR1 to determine that the anomaly monitor circuit 11 is operating normally.

At this time, the gate voltage monitor circuit 15, if normal, outputs a monitoring result indicating that the gate voltage Vg of the power transistor TR1 is forcibly fixed to a predetermined voltage, if not normal, and outputs the opposite monitoring result to it. When the result of monitoring by the gate voltage monitor circuit 15 and the control signal IN outputted from the control circuit 17 have the same values, the logic circuit 13 sets the error signal ERR2 to inactive (e.g., L-level). The control circuit 17 determines that the gate-voltage monitor circuit 15 is operating normally by receiving the inactive error signal ERR2.

When the control circuit 17 determines that both the anomaly monitor circuit 11 and the gate voltage monitor circuit 15 normally operate (Yes in Step S104), the threshold voltage Vt is returned to the level used in the normal operation, and then the normal operation starts (Step S105→S106).

In contrast, the control circuit 17, when it is determined that either the abnormal monitoring circuit 11 and the gate voltage monitor circuit 15 does not operate normally (NO in step S104), for example, to stop the operation of the gate drive circuit 10, or notifies an user that the power transistor TR1 is not operating properly (step S107).

As described above, when the operation mode is the test mode, the device 1 and the power supply system SYS1 including the device 1 are configured to test the anomaly monitor circuit 11 and the gate voltage monitor circuit 15 after adjusting the threshold voltage Vt so as to determine that the state of the stress applied to the power transistor TR1 is abnormal in the case of the anomaly monitor circuit 11 operating normally. As a result, the drive device 1 and the power supply system SYS1 can monitor the state of the stress applied to the power transistor TR1 by using the anomaly monitor circuit 11 and the gate voltage monitor circuit 15, which are highly reliable, so that the safety of the power supply system can be improved.

Although the reference voltage Vr supplied to the gate-voltage monitoring circuit 15 is fixed in present embodiment, the reference voltage Vr may not be fixed. The reference voltage Vr may be adjustable by the threshold voltage setting circuit 12 or the like. As a result, a more detailed test of the gate voltage monitor circuit 15 is possible.

Second Embodiment

Figure 4:
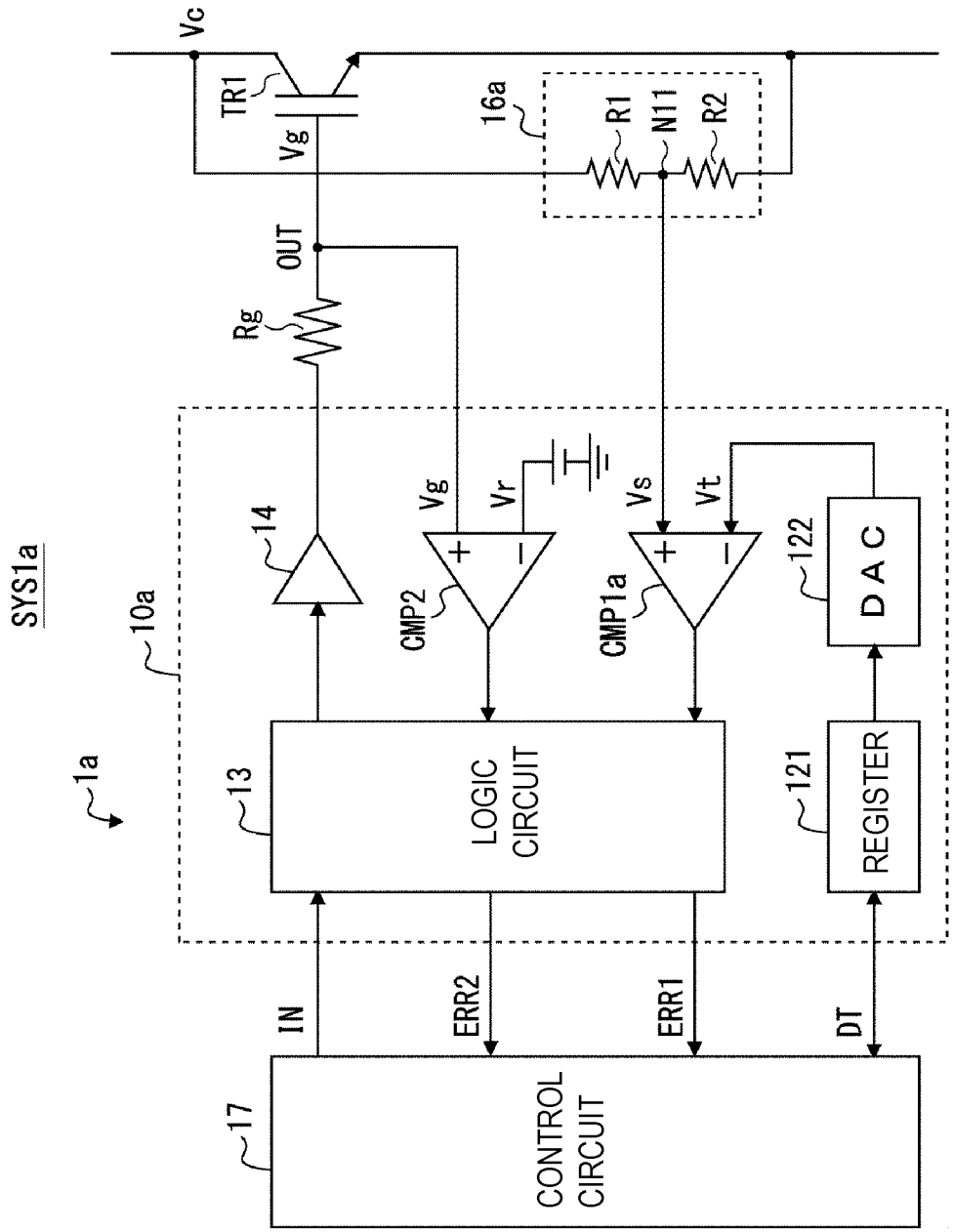
FIG. 4 is a diagram showing a configuration example of a power supplying system according to a second embodiment.

FIG. 4 is a diagram illustrating a configuration example of a power supply system SYS1a according to the second embodiment. In the power supply system SYS1a, the anomaly monitor circuit 11 is configured to monitor the voltage applied to the power transistor TR1. Hereafter, a concrete description will be given.

As shown in FIG. 4, the power supply system SYS1a includes a power transistor TR1 and a drive device 1a for driving the power transistor TR1. The drive device 1a includes at least a gate drive circuit 10a, a sensor 16a, a control circuit 17, and a resistor Rg.

The sensor 16a corresponds to the sensor 16 and includes resistors R1 and R2. The resistive elements R1 and R2 are provided in series between a collector (first terminal) and an emitter (second terminal) of the power transistor TR1. The sensor 16a outputs a voltage of a node N11 between the resistors R1 and R2 as a detection voltage Vs. The detected voltage Vs increases as the applied voltage of the power transistor TR1 increases, and decreases as the applied voltage of the power transistor TR1 decreases.

The gate drive circuit 10a corresponds to the gate drive circuit 10, and includes a comparator CMP1a, a comparator CMP2, a logic circuit 13, a buffer 14, a register 121, and a digital-to-analog converter 122. The comparator CMP1a is used as anomaly monitor circuit 11. The comparator CMP2 is used as gate-voltage monitor circuit 15. The register 121 and the DA converter 122 are used as the threshold voltage setting circuit 12.

The register 121 stores information (digital value) DT of the threshold voltage Vt specified by the control circuit 17.

The DA converter 122 converts the digital value DT stored in the register 121 into a threshold voltage Vt and outputs the threshold voltage Vt.

The comparator CMP1a compares the threshold voltage Vt with the detection threshold voltage Vs, and outputs the comparison result as a monitoring result by the anomaly monitor circuit 11.

For example, when the detected voltage Vs is less than the threshold voltage Vt, the comparator CMP1a outputs an L-level monitoring result indicating that the applied voltage of the power transistor TR1 is within a normal range. When the detected voltage Vs is equal to or higher than the threshold voltage Vt, the comparator CMP1a outputs an H-level monitoring result indicating that the applied voltage of the power transistor TR1 is in an overvoltage condition.

Logic circuit 13, upon receiving the H-level monitoring result from the comparator CMP1a, activates the error signal ERR1. When the active-state error signal ERR1 is received, the control circuit 17 instructs the gate drive circuit 10a to forcibly turn on the power transistor TR1. The gate driver 10a forcibly turns on the power transistor TR1 by fixing the gate voltage Vg of the power transistor TR1 to the H-level. This eliminates the overvoltage condition of the power transistor TR1, thereby suppressing breakdown and unintentional degradation of the power transistor TR1.

The comparator CMP2 compares the gate voltage Vg with the reference voltage Vr, and outputs the comparison result as a monitoring result by the gate voltage monitor circuit 15. The specific operation of the comparator CMP2 and the operation of the logic circuit 13 and the control circuit 17 based on the monitoring result of the comparator CMP2 are the same as those of the gate voltage monitor circuit 15, the logic circuit 13, and the control circuit 17 according to the first embodiment, and therefore their descriptions are omitted.

(Test Operation of the Gate Drive Circuit 10a)

Subsequently, the test operation of the gate drive circuit 10a provided in the power supply system SYS1a will be described. First, in the test mode, a normal-level voltage in the normal operation mode is applied to the power transistor TR1. Specifically, a voltage of, for example, 400V is applied to the collector of the power transistors TR1. At this time, the detected voltage Vs indicates, for example, a 4V of one hundredth of the collector voltage.

Thereafter, the control circuit 17 switches the level of the threshold voltage Vt so that the detection voltage Vs becomes equal to or higher than the threshold voltage Vt. In other words, the control circuit 17 lowers the level of the threshold voltage Vt (e.g., from the normal 6V to 3V) so as to output the monitoring result of the H level indicating that the power transistor TR1 is an overvoltage condition if the comparator CMP1a operates normally.

Thereafter, the controller 17 confirms the monitoring results of the comparators CMP1a, and CMP2.

At this time, since the detected voltage Vs (=4V) becomes higher than the threshold voltage Vt (=3V), the comparator CMP1a outputs the monitoring result of the H level when the threshold voltage Vt is normal, and outputs the monitoring result of the L level when the threshold voltage Vt is not normal. Logic circuit 13 receives the monitoring result of the H level from the comparator CMP1a, to activate the error signal ERR1 (e.g., H level). The control circuit 17 receives the active-state error signal ERR1 to determine that the comparator CMP1a is operating normally.

At this time, the comparator CMP2 outputs the monitoring result of the H level indicating that the gate voltage Vg of the power transistor TR1 is forcibly fixed to the H level if the gate voltage Vg is normal, and outputs the monitoring result of the L level if the gate voltage Vg is not normal. The logic circuit 13 sets the error signal ERR2 to inactive (e.g., L level) when the result of monitoring by the comparator CMP2 and the control signal IN outputted from the control circuit 17 indicate the same value (H level). The control circuit 17 receives the inactive error signal ERR2, and the control circuit 17 determines that the comparator CMP2 is operating normally.

Control circuit 17, when both of the comparators CMP1a, and CMP2 are determined to be operating normally, after returning the threshold voltage Vt to the level used in the normal operation (e.g., 6V), starts the normal operation. In contrast, the control circuit 17, if it is determined that not normally operated in either of the comparators CMP1a, or CMP2, for example, to stop the operation of the gate drive circuit 10a, or notifies the user that the power transistor TR1 is not operating properly.

The rest of the configuration and the operation of the drive device 1a are the same as those of the drive device 1, and therefore descriptions thereof are omitted.

As described above, when the operation mode is the test mode, the device 1a and the power supplying system SYS1a including the device 1a are configured to test the comparators CMP1a, and CMP2 after lowering the threshold voltage Vt so that the threshold voltage Vt is determined that the applied voltage of the power transistor TR1 is in the overvoltage condition if the comparator CMP1a normally operates. Thus, the drive device 1a and the power supply system SYS1a having the device 1a can monitor the applied voltage of the power transistor TR1 using reliable comparators CMP1a, and CMP2, it is possible to improve the safety. It should be noted that the drive device 1a and the power-supply-system SYS1a provided with it can be easily tested without generating high voltage.

(Application Examples of the Power Supply System SYS1a and its Test Operation)

Next, an application example of the power supply system SYS1a and its test operation will be described. In the present embodiment, the power supply system SYS1a is applied to an inverter circuit.

Figure 5:
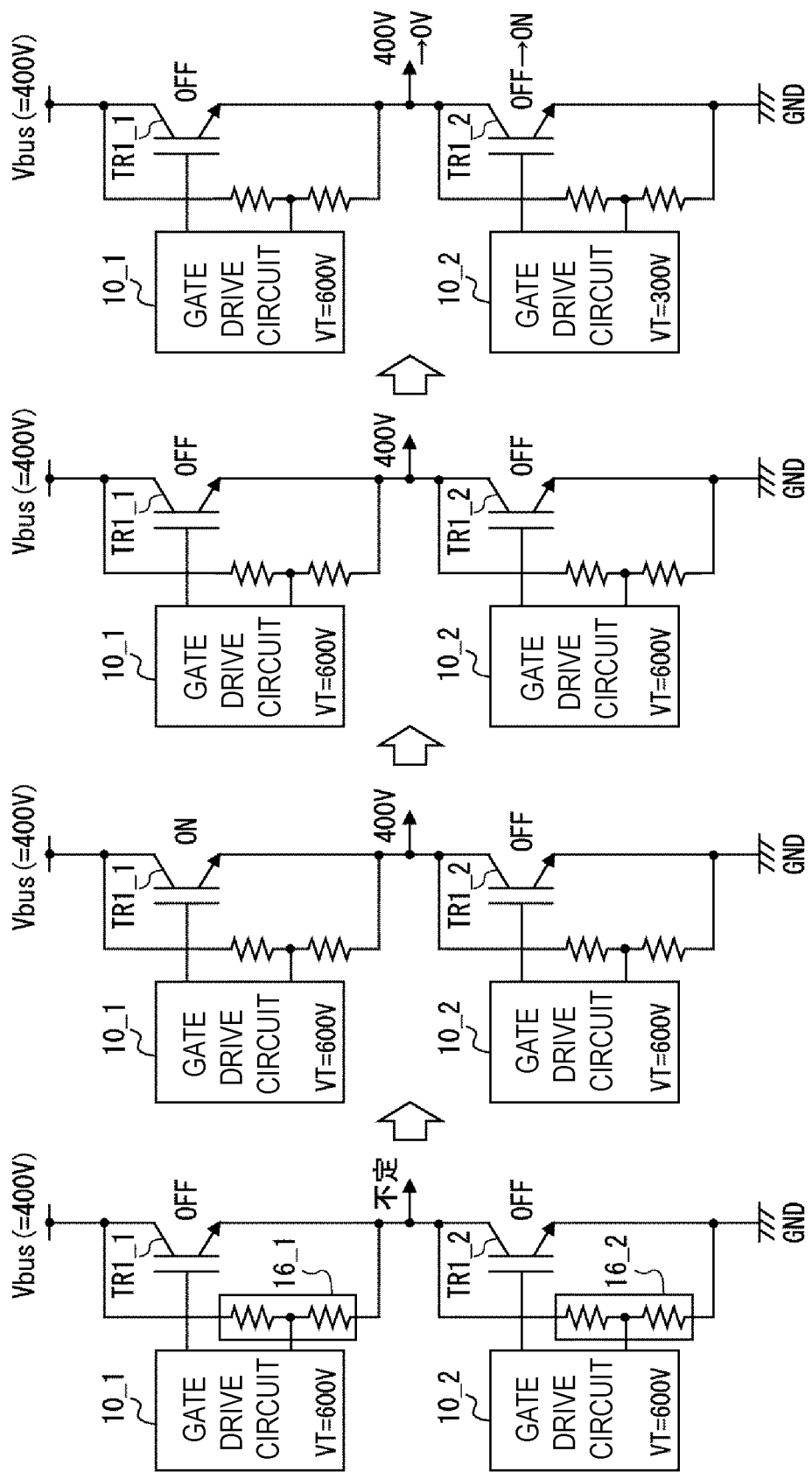
FIG. 5 is a diagram for explaining a test operation of the gate drive circuit provided corresponding to a lower arm of an inverter circuit.
Figure 6:
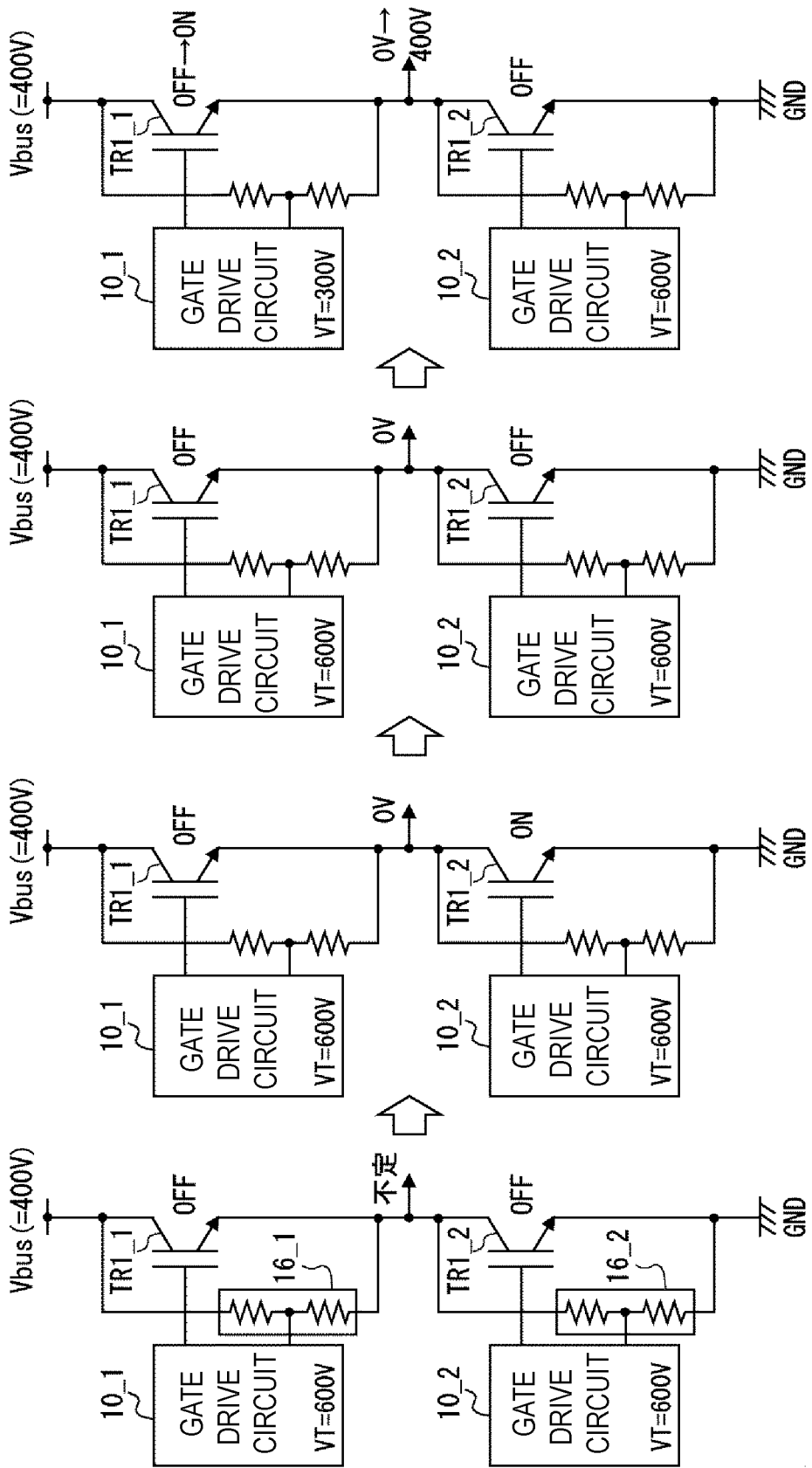
FIG. 6 is a diagram for explaining a test operation of the gate drive circuit provided corresponding to an upper arm of the inverter circuit.

FIG. 5 is a diagram for explaining a test operation of the gate drive circuit provided corresponding to a lower arm of the inverter circuit. FIG. 6 is a diagram for explaining a test operation of the gate drive circuit provided corresponding to an upper arm of the inverter circuit.

As shown in FIGS. 5 and 6, the inverter circuit includes a power transistor TR1_1, a power transistor TR1_2, gate driving circuits 10_1 and 10_2, and sensors 16_1 and 16_2.

The power transistors TR1_1 and TR1_2 are provided in series between a power supply voltage terminal (Hereinafter, referred to as a power voltage terminal Vbus) to which the power supply voltage Vbus is supplied and a ground voltage terminal GND. Each of the power transistors TR1_1 and TR1_2 corresponds to the power transistor TR1, and constitutes the upper arm and the lower arm of the inverter circuit, respectively.

Each of the sensors 16_1 and 16_2 corresponds to the sensor 16a, and detects the applied voltages of the power transistors TR1_1 and TR1_2, respectively. Each of the gate driving circuits 10_1 and 10_2 corresponds to the gate drive circuit 10a and drives the gates of the power transistors TR1_1 and TR1_2, respectively.

First, a test operation of the gate drive circuit 10_2 provided corresponding to the lower arm TR1_2 will be described with reference to FIG. 5.

In the initial state, the power supply voltage Vbus, for example, 400V, is applied to the power supply voltage terminal in a state in which both of the power transistors TR1_1 and TR1_2 are turned off. The threshold voltage Vt of each of the gate driving circuits 10_1 and 10_2 is set to, for example, 600V.

Thereafter, the power transistor TR1_1 is switched from off to on with the power transistor TR1_2 kept off. As a result, the output terminal between the power transistors TR1_1 and TR1_2 is precharged to the power supply voltage Vbus level 400V. After the precharge is completed, the power transistor TR1_1 is switched from on to off again. At this time, a voltage of the power supply voltage Vbus is applied between the collector and the emitter of the power transistors TR1_2.

Thereafter, the threshold voltage Vt of the gate drive circuit 10_2 is switched to a voltage level lower than the power supply voltage Vbus, for example, 300V. As a result, the test of the anomaly monitor circuit 11 and the gate voltage monitor circuit 15 provided in the gate drive circuit 10_2 is performed. When the anomaly monitor circuit 11 provided in the gate drive circuit 10_2 operates normally, the power transistor TR1_2 is forcibly controlled to be turned on.

Next, a test operation of the gate drive circuit 10_1 provided corresponding to the upper arm TR1_1 will be described with reference to FIG. 6.

In the initial state, the power supply voltage Vbus, for example, 400V, is applied to the power supply voltage terminal in a state in which both of the power transistors TR1_1 and TR1_2 are turned off. The threshold voltage Vt of each of the gate driving circuits 10_1 and 10_2 is set to, for example, 600V.

Thereafter, the power transistor TR1_2 is switched from off to on with the power transistor TR1_1 kept off. As a result, the output terminal between the power transistors TR1_1 and TR1_2 is precharged to the ground voltage GND level (0V). After the precharge is completed, the power transistor TR1_2 is switched from on to off again. At this time, a voltage of the power supply voltage Vbus is applied between the collector and the emitter of the power transistor TR1_1.

Thereafter, the threshold voltage Vt of the gate drive circuit 10_1 is switched to a voltage level lower than the power supply voltage Vbus, for example, 300V. As a result, the test of the anomaly monitor circuit 11 and the gate voltage monitor circuit 15 provided in the gate drive circuit 10_1 is performed. When the anomaly monitor circuit 11 provided in the gate drive circuit 10_1 operates normally, the power transistor TR1_1 is forcibly controlled to be turned on.

As described above, the power supply system SYS1a applied to the inverter circuit tests the gate drive circuits 10_1 and 10_2 without short-circuiting the power supply voltage terminal Vbus and the ground voltage terminal GND. This suppresses destruction and unintentional deterioration of the loads of the power transistors TR1_1 and TR1_2 and the motor due to a short-circuit current.

Third Embodiment

Figure 7:
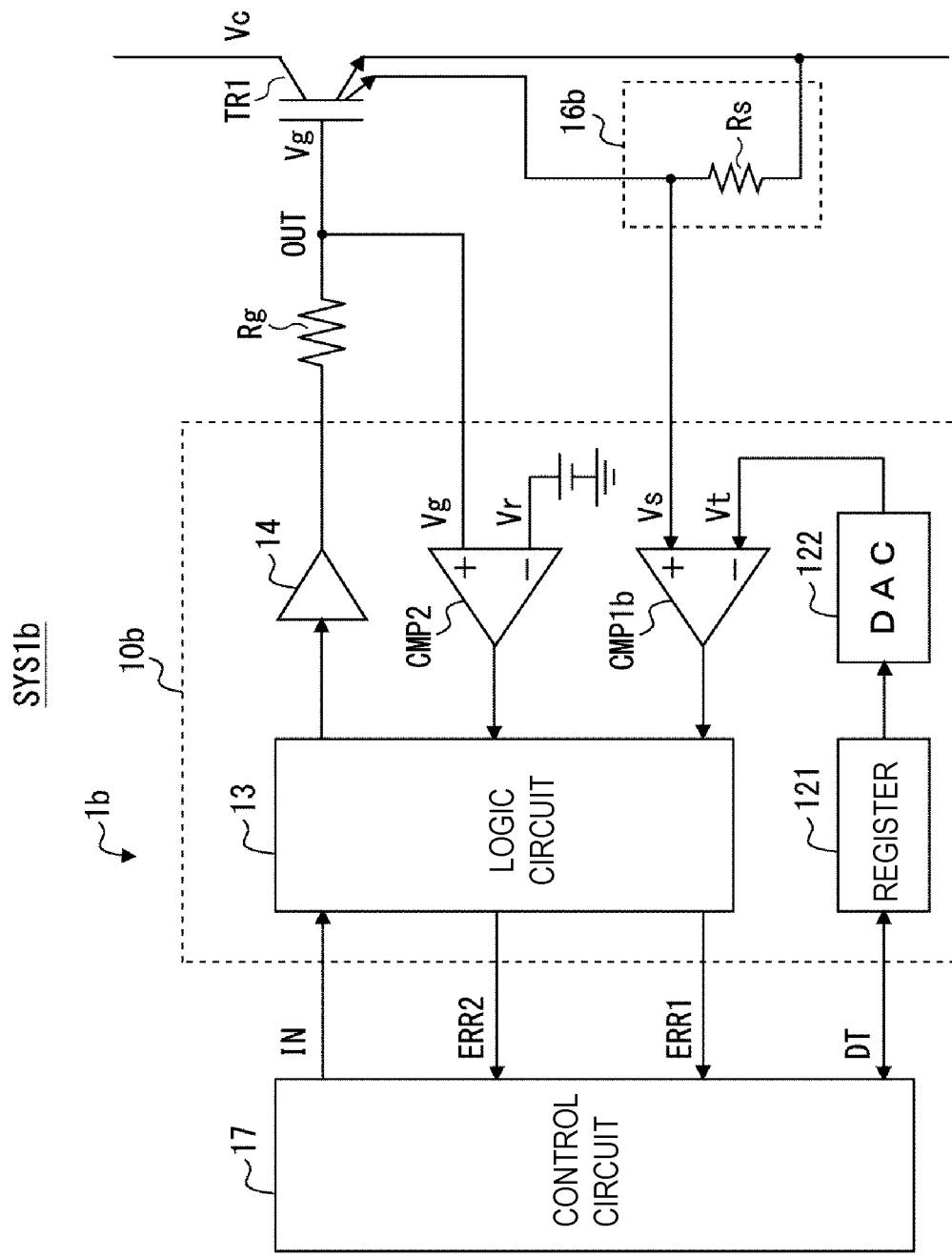
FIG. 7 is a diagram showing a configuration example of a power supplying system according to a third embodiment.

FIG. 7 is a diagram illustrating a configuration example of a power supply system SYS1b according to the third embodiment. In the power supply system SYS1b, the anomaly monitor circuit 11 is configured to monitor a current flowing through the power transistor TR1. Hereafter, a concrete description will be given.

As shown in FIG. 7, the power supply system SYS1b includes a power transistor TR1 and a drive device 1b for driving the power transistor TR1. The drive device 1b includes at least a gate drive circuit 10b, a sensor 16b, a control circuit 17, and a resistor Rg. In the present embodiment, the power transistor TR1 is a multi-emitter type IGBT. For example, a current of 1/10000 of the emitter flows through the current sensing emitter of the multi-emitter type IGBT.

The sensor 16b corresponds to the sensor 16 and includes a resistor Rs. The sensor 16b converts the current flowing through the current sensing emitter of the power transistor TR1 into the detection voltage Vs using the resistor Rs, and outputs the detection voltage Vs. The detected voltage Vs increases as the current flowing through the power transistor TR1 increases, and the detected voltage Vs decreases as the current flowing through the power transistor TR1 decreases.

The gate drive circuit 10b corresponds to the gate drive circuit 10, and includes a comparator CMP1b, a comparator CMP2, a logic circuit 13, a buffer 14, a register 121, and a digital-to-analog converter 122. The comparator CMP1b is used as anomaly monitor circuit 11. The comparator CMP2 is used as gate-voltage monitor circuit 15. The register 121 and the DA converter 122 are used as the threshold voltage setting circuit 12.

The comparator CMP1b compares the threshold voltage Vt with the detection threshold voltage Vs, and outputs the comparison result as a monitoring result by the anomaly monitoring circuit 11.

For example, when the detected voltage Vs is less than the threshold voltage Vt, the comparator CMP1b outputs an L-level monitoring result indicating that the current flowing through the power transistor TR1 is within the normal range. When the detected voltage Vs is equal to or higher than the threshold voltage Vt, the comparator CMP1b outputs an H-level monitoring result indicating that the current flowing through the power transistor TR1 is in an overcurrent condition.

Logic circuit 13, upon receiving the H-level monitoring result from the comparator CMP1b, activates the error signal ERR1. When the active-state error signal ERR1 is received, the control circuit 17 instructs the gate drive circuit 10b to forcibly turn off the power transistor TR1. The gate driver 10b forcibly turns off the power transistor TR1 by fixing the gate voltage Vg of the power transistor TR1 to L-level. This eliminates the overcurrent condition of the power transistor TR1, thereby suppressing breakdown and unintentional degradation of the power transistor TR1.

The comparator CMP2 compares the gate voltage Vg with the reference voltage Vr, and outputs the comparison result as a monitoring result by the gate voltage monitor circuit 15. The specific operation of the comparator CMP2 and the operation of the logic circuit 13 and the control circuit 17 based on the monitoring result of the comparator CMP2 are the same as those of the gate voltage monitor circuit 15, the logic circuit 13, and the control circuit 17 according to the first embodiment, and therefore their descriptions are omitted.

(Test Operation of the Gate Drive Circuit 10b)

Subsequently, the test operation of the gate drive circuit 10b provided in the power supply system SYS1b will be described. First, in the test mode, a normal-level current in the normal operation mode is supplied to the power transistor TR1.

Thereafter, the control circuit 17 switches the level of the threshold voltage Vt so that the detection voltage Vs becomes equal to or higher than the threshold voltage Vt. In other words, the control circuit 17 lowers the level of the threshold voltage Vt so as to output the monitoring result of the H level indicating that the current flowing through the power transistor TR1 is an overcurrent condition if the comparator CMP1b operates normally.

Although the present embodiment exemplifies a case in which a current flows through the power transistor TR1 and the level of the threshold voltage Vt is lowered in the test mode, the present invention is not limited to this case. For example, the threshold voltage Vt may be reduced to a negative threshold voltage without passing a current through the power transistor TR1. Alternatively, a DC-offset may be added between the two inputs of the comparator CMP1b without passing a current through the power transistor TR1.

Thereafter, the controller 17 confirms the monitoring results of the comparators CMP1b, and CMP2.

At this time, the comparator CMP1b outputs the monitoring result of the H level if it is normal, and outputs the monitoring result of the L level if it is not normal. Logic circuit 13 receives the monitoring result of the H level from the comparator CMP1b, to activate the error signal ERR1 (e.g., H level). The control circuit 17 receives the active-state error signal ERR1 to determine that the comparator CMP1b is operating normally. At this time, if the comparator CMP2 is normal, the comparator outputs the monitoring result of the L level indicating that the gate voltage Vg of the power transistor TR1 is forcibly fixed to the L level within a predetermined period of time, for example, within 1 μs, and outputs the monitoring result of the H level if the gate voltage Vg is not normal. When the monitoring result by the comparator CMP2 and the control signal IN outputted from the comparator 17 indicate the same value (L level), the logic circuit 13 inactivates the error signal ERR2 (e.g., L level). The control circuit 17 receives the inactive error signal ERR2, and the control circuit 17 determines that the comparator CMP2 is operating normally.

When the control circuit 17 determines that all of the comparators CMP1b, and CMP2 operate normally, the control circuit 17 returns the threshold voltage Vt to the level used in the normal operation, and then starts the normal operation. In contrast, the control circuit 17, if it is determined that not normally operated in either of the comparator CMP1b, or CMP2, for example, to stop the operation of the gate drive circuit 10b, or notifies the user that the power transistor TR1 is not operating properly.

The rest of the configuration and the operation of the drive device 1b are the same as those of the drive device 1, and therefore descriptions thereof are omitted.

In this manner, when the operation mode is the test mode, the device 1b and the power supplying system SYS1b including the device 1bs are configured to test the comparators CMP1b, and CMP2 after lowering the threshold voltage Vt so as to determine that the current flowing through the power transistor TR1 is in the overcurrent state if the comparator CMP1b normally operates. Thus, the drive device 1b and the power supply system SYS1b therewith, since it is possible to monitor the state of the current flowing through the power transistor TR1 using reliable comparators CMP1b, and CMP2, it is possible to improve the safety. Incidentally, the drive device 1b and the power supply system SYS1b having the same can be easily tested without generating an overcurrent.

In the present embodiment, the power transistor TR1 is a multi-emitter IGBT, and the current flowing through the current sensing emitter of the power transistor TR1 is converted into the detected voltage Vs and used, but the present invention is not limited thereto. The power transistor TR1 may be a multi-source MOSFET, and the current flowing in the current sensing source of the power transistor TR1 may be converted into the detected voltage Vs and used. In addition, for example, a voltage proportional to the collector-emitter voltage of the power transistor TR1 may be used as the detection voltage Vs by utilizing a phenomenon that the collector-emitter voltage of the IGBT increases as the collector current of the IGBT increases (hereinafter, this current detection system is referred to as a DESAT method).

When the DESAT system is adopted, in the test mode, the power transistor TR1 is turned off to raise the collector voltage, whereby the comparator CMP1c can be made to test whether or not to detect an overcurrent condition of the power transistor TR1. However, in the normal operation mode, when the power transistor TR1 is off, even if the collector voltage rises, the comparator CMP1b needs to consider that the power transistor TR1 is not abnormal.

Fourth Embodiment

Figure 8:
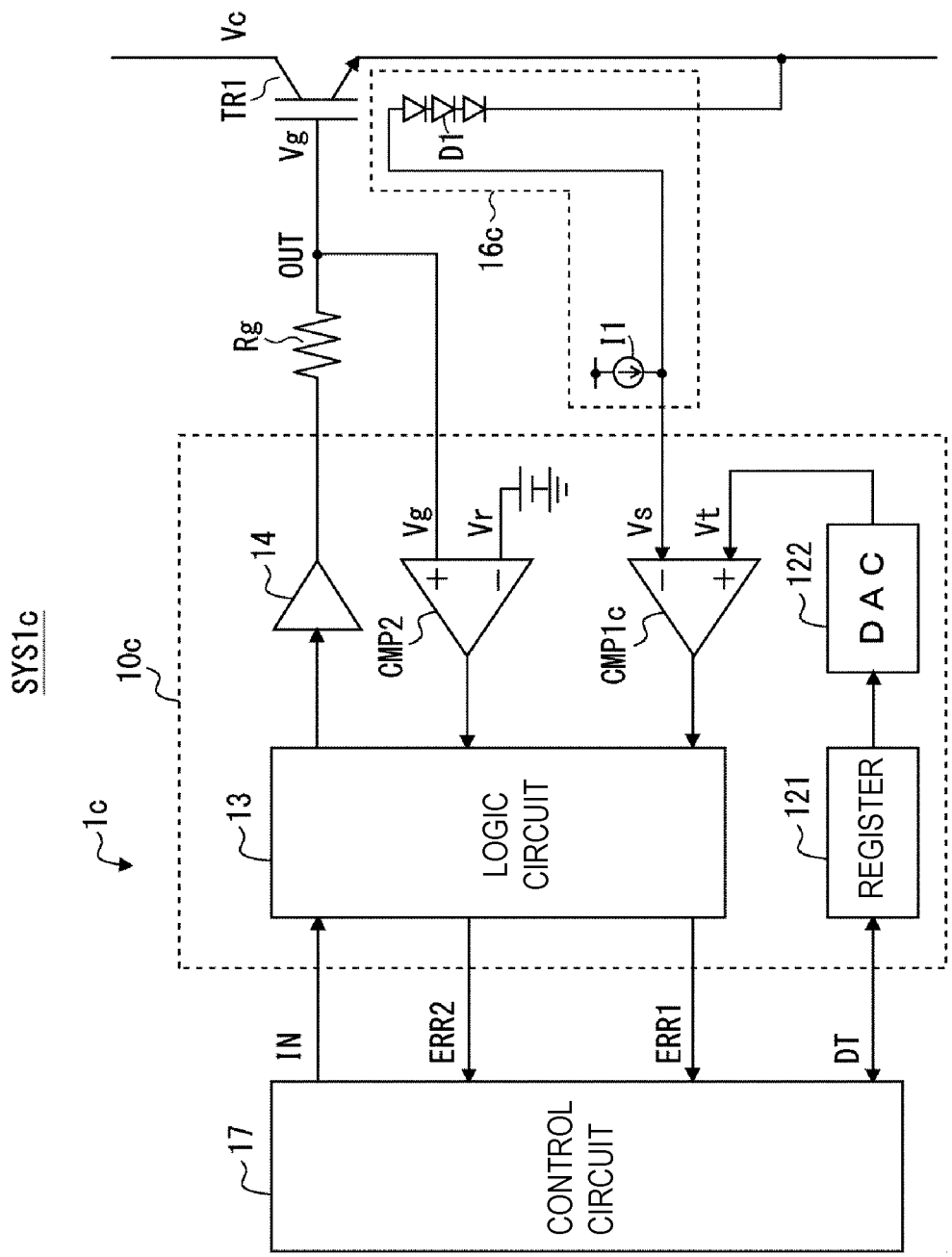
FIG. 8 is a diagram showing a configuration example of a power supplying system according to a fourth embodiment.

FIG. 8 is a diagram illustrating a configuration example of a power supply system SYS1c according to the fourth embodiment. In the power supply system SYS1c, the anomaly monitor circuit 11 is configured to monitor the temperature of the power transistor TR1. Hereafter, a concrete description will be given.

As shown in FIG. 8, the power supply system SYS1c includes a power transistor TR1 and a drive device 1c for driving the power transistor TR1. The drive device 1c includes at least a gate drive circuit 10c, a sensor 16c, a control circuit 17, and a resistor Rg.

The sensor 16c corresponds to the sensor 16 and includes a constant current source I1 and a diode D1. The diode D1 is provided in the vicinity of the power transistor TR1, for example, on a chip on which the power transistor TR1 is formed. Therefore, a temperature of the diode D1 is equivalent to a temperature of the power transistor TR1. On the other hand, the constant current source I1 is provided, for example, on a chip on which the gate drive circuit 10c is mounted.

A constant current output from the constant current source I1 flows through the diode D1. The sensor 16c outputs the forward voltage of the diode D1 as the detection voltage Vs. The detected voltage Vs is higher than the 0V voltage even at normal temperature. Specifically, the detected voltage Vs indicates a value of about an intermediate value between the 0V and the logic power supply voltage or the analogue power supply voltage even at room temperature. Further, the forward voltage of the diode D1 becomes smaller as the temperature of the power transistor TR1 increases and becomes larger as the temperature of the power transistor TR1 decreases. The sensor 16c is not limited to the above-described configuration, and may be configured by a thermistor or a thermocouple.

The gate drive circuit 10c corresponds to the gate drive circuit 10, and includes a comparator CMP1c, a comparator CMP2, a logic circuit 13, a buffer 14, a register 121, and a digital-to-analog converter 122. The comparator CMP1c is used as anomaly monitor circuit 11. The comparator CMP2 is used as gate-voltage monitor circuit 15. The register 121 and the DA converter 122 are used as the threshold voltage setting circuit 12.

The comparator CMP1c compares the threshold voltage Vt with the detection threshold voltage Vs, and outputs the comparison result as a monitoring result by the anomaly monitor circuit 11.

For example, when the detected voltage Vs is equal to or higher than the threshold voltage Vt, the comparator CMP1c outputs an L-level monitoring result indicating that the temperature of the power transistor TR1 is within a normal range. When the detected voltage Vs is less than the threshold voltage Vt, the comparator CMP1c outputs an H-level monitoring result indicating that the temperature of the power transistor TR1 is overheated.

Logic circuit 13, upon receiving the H-level monitoring result from the comparator CMP1c, activates the error signal ERR1. When the active-state error signal ERR1 is received, the control circuit 17 instructs the gate drive circuit 10c to forcibly turn off the power transistor TR1. The gate driver 10c forcibly turns off the power transistor TR1 by fixing the gate voltage Vg of the power transistor TR1 to L-level. This eliminates the overheating of the power transistor TR1, thereby suppressing breakdown and unintentional degradation of the power transistor TR1.

The comparator CMP2 compares the gate voltage Vg with the reference voltage Vr, and outputs the comparison result as a monitoring result by the gate voltage monitor circuit 15. The specific operation of the comparator CMP2 and the operations of the logic circuit 13 and the control circuit 17 based on the monitoring result of the comparator CMP2 are the same as those of the gate voltage monitor circuit 15, the logic circuit 13, and the control circuit 17 according to the first embodiment, and therefore their descriptions are omitted.

(Test Operation of the Gate Drive Circuit 10c)

Subsequently, the test operation of the gate drive circuit 10c provided in the power supply system SYS1c will be described.

First, in the test mode, the power transistor TR1 is set to a normal temperature. Thereafter, the control circuit 17 switches the level of the threshold voltage Vt so that the detection voltage Vs becomes equal to or higher than the threshold voltage Vt. In other words, the control circuit 17 lowers the level of the threshold voltage Vt so as to output the monitoring result of the H level indicating that the temperature of the power transistor TR1 is overheated if the comparator CMP1c operates normally.

Thereafter, the controller 17 confirms each monitoring results of the comparators CMP1c, and CMP2.

At this time, the comparator CMP1c outputs the monitoring result of the H level if it is normal, and outputs the monitoring result of the L level if it is not normal. Logic circuit 13 receives the monitoring result of the H level from the comparator CMP1c, to activate the error signal ERR1 (e.g., H level). The control circuit 17 receives the active-state error signal ERR1 to determine that the comparator CMP1c is operating normally.

At this time, if the comparator CMP2 is normal, the comparator outputs the monitoring result of the L level indicating that the gate voltage Vg of the power transistor TR1 is forcibly fixed to the L level within a predetermined period of time, for example, within 1 μs, and outputs the monitoring result of the H level if the gate voltage Vg is not normal. When the monitoring result by the comparator CMP2 and the control signal IN outputted from the comparator 17 indicate the same value (L level), the logic circuit 13 inactivates the error signal ERR2 (e.g., L level). The control circuit 17 receives the inactive error signal ERR2, and the control circuit 17 determines that the comparator CMP2 is operating normally.

When the control circuit 17 determines that both of the comparators CMP1c,CMP2 operate normally, the control circuit 17 returns the threshold voltage Vt to the level used in the normal operation, and then starts the normal operation. Incidentally, the control circuit 17, if it is determined that not normally operated in either of the comparator CMP1c, or CMP2, for example, to stop the operation of the gate drive circuit 10c, or notifies the user that the power transistor TR1 is not operating properly.

The rest of the configuration and the operation of the drive device 1c are the same as those of the drive device 1, and therefore descriptions thereof are omitted.

As described above, when the operation mode is the test mode, the present embodiment drive device 1c and the power supplying system SYS1c including the drive device 1c are configured to test the comparators CMP1c, and CMP2 after the threshold voltage Vt is lowered to determine that the power transistor TR1 is overheated if the comparator CMP1c normally operates. Thus, the drive device 1c and the power supply system SYS1c with it, it is possible to monitor the state of the current flowing through the power transistor TR1 using reliable comparators CMP1c, and CMP2, it is possible to improve the safety. It should be noted that the drive device 1c and the power supply-system SYS1c provided with it can be easily tested without overheating.

Fifth Embodiment

The gate voltage monitor circuit 15 according to the first to fourth embodiments may use a comparator provided in an active mirror clamp circuit to be described later. This suppresses an increase in the circuit scale of the gate drive circuit 10.

In addition, the active mirror clamp circuit may have a function of detecting whether noises are generated in the gates of the power transistors TR1, which noises are liable to cause erroneous ignition. Hereafter, a concrete description will be given.

First, a general active mirror clamp circuit will be described. Generally, when the collector voltage of the off-state power transistor TR1 rises sharply, the rise of the collector voltage propagates to the gate through the feedback capacitor formed between the gate and the collector, and the gate voltage Vg rises unintentionally. Here, if the gate voltage Vg rises above the threshold voltage of the power transistor TR1, the power transistor TR1 is turned on unintentionally, so that the power transistor TR1 may be damaged or deteriorated unintentionally. In order to solve such problem, the gate drive circuit 10 is usually provided with an active mirror clamp circuit for clamping the gate of the power transistor TR1.

Figure 9:
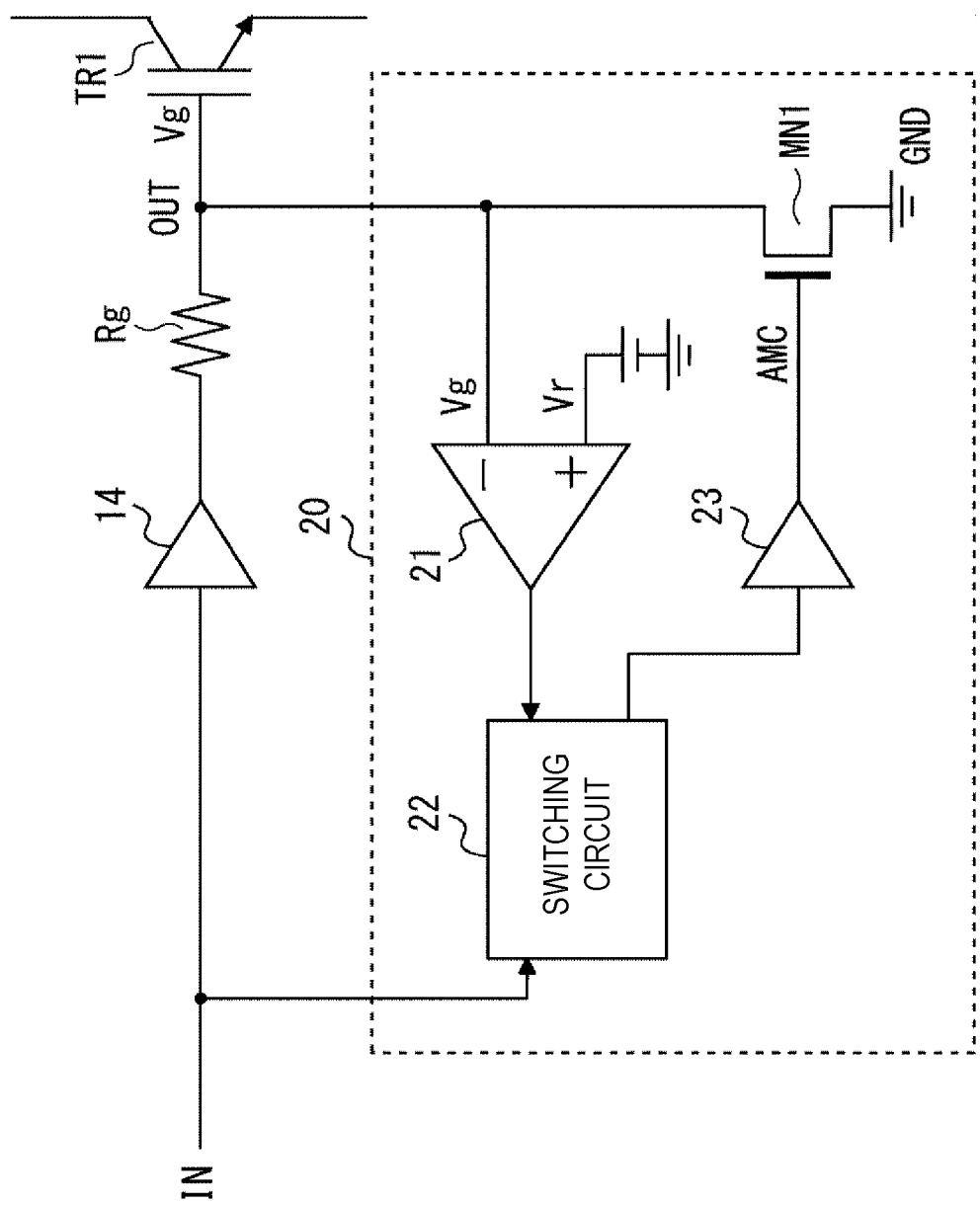
FIG. 9 is a diagram showing a configuration example of an active mirror clamp circuit.

FIG. 9 is a diagram showing a configuration example of the active mirror clamp circuit 20. As shown in FIG. 9, the active mirror clamp circuit 20 includes a comparator 21, a switching circuit 22, a buffer 23, and an N-channel MOS transistor MN1 (Switching element; Hereinafter referred to as a transistor simply).

The comparator 21 compares the gate voltage Vg of the power transistor TR1 with the reference voltage Vr, and outputs a comparison result. Specifically, the comparator 21 outputs the comparison result of L level when the gate voltage Vg is equal to or higher than the reference voltage Vr, and outputs the comparison result of H level when the gate voltage Vg is less than the reference voltage Vr. Note that the reference voltage Vr indicates a value lower than a boundary value (threshold value) at which the power transistor TR1 is switched on and off.

Switching circuit 22, in response to the control signal IN (OUT) output from the control circuit 17 is switched from H level to L level, switches the power transistor TR1 from on to off. Then, further gate voltage Vg is reduced to less than the reference voltage Vr, switching circuit 22 switches the control signal AMC from L level to H level.

The control signals AMC are applied to the gate of the transistor MN1 via buffer 23. The transistor MN1 is provided between the gate of the power transistor TR1 and the ground-voltage terminal, and switches on and off based on the control signal AMC. For example, when the control signal AMC is switched from the L level to the H level, the transistor TR1 is switched from the off state to the on state in response to the control signal AMC. As a result, the gate voltage Vg of the power transistor TR1 quickly drops to the ground level.

Note that the switching circuit 22 continues to output the control signal AMC of H level even when the gate voltage Vg temporarily rises above the reference voltage Vr during the period in which the control signal IN indicates L level. Therefore, the gate voltage Vg of the power transistor TR1 is maintained at the ground level.

At this time, the gate voltage Vg of the power transistor TR1 is directly fixed to the ground level without passing through the resistor Rg. Therefore, even when the collector voltage Vc of the off-state power transistor TR1 rises sharply, the rise of the gate voltage Vg is suppressed. As a result, the power transistor TR1 is not turned on unintentionally, so that breakage and unintentional degradation of the power transistor TR1 are suppressed.

In the turn-off process of the power transistor TR1, the gate voltage Vg is controlled by the control signal OUT supplied from the control circuit 17 via the resistor Rg until the gate voltage Vg falls below a boundary value (threshold value) at which the power transistor TR1 is switched on and off. Also in the turn-on process of the power transistor TR1, the gate voltage Vg is controlled by the control signal OUT supplied from the control circuit 17 via the resistor Rg. Therefore, the ON/OFF switching speed of the power transistor TR1 is controlled to a desired speed by the control circuit 17 without being affected by the clamp by the active mirror clamp circuit 20.

Next, an active mirror clamp circuit according to the present embodiment having a function of detecting the occurrence of noises in the gates of the power transistors TR1 will be described. In the following explanation, comparators provided in the active mirror clamp circuit according to the present embodiment are also used as the gate-voltage monitor circuit 15.

Figure 10:
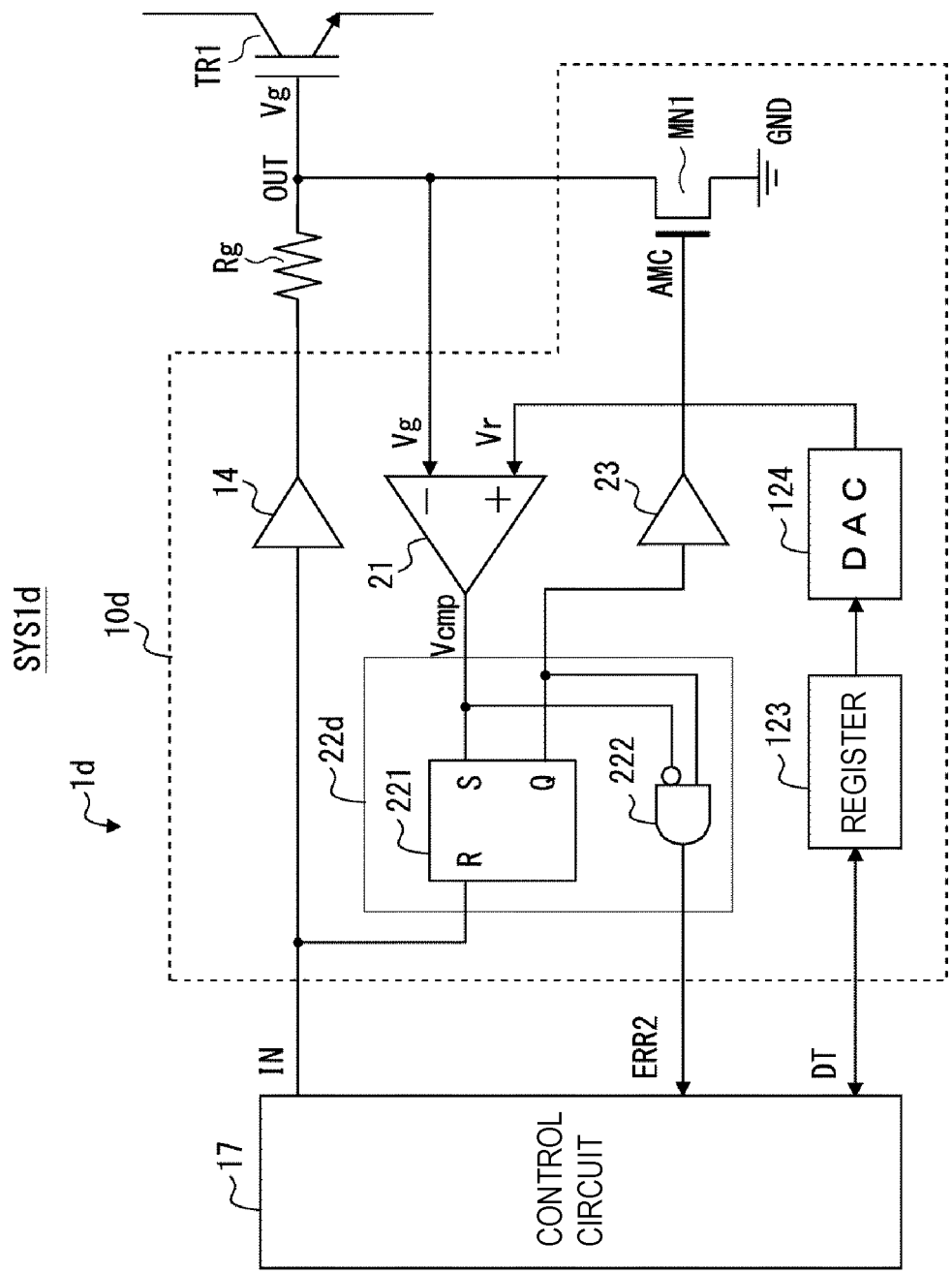
FIG. 10 is a diagram showing a configuration example of a power supplying system according to a fifth embodiment.

FIG. 10 is a diagram showing an example of configuration of a power supplying system SYS1d according to the fifth embodiment. As shown in FIG. 10, the power supply system SYS1d includes a power transistor TR1 and a drive device 1d for driving the power transistor TR1. The drive device 1d includes at least a gate drive circuit 10d, the control circuit 17, and a resistor Rg. In the example shown in FIG. 10, the components corresponding to the anomaly monitor circuit 11 among the components of the gate drive circuit 10d are omitted. Accordingly, the sensor 16 is also omitted.

The gate drive circuit 10d includes a comparator 21, a switching circuit 22d, the buffer 23, and the transistor MN1, which are constituent elements of the active mirror clamp circuit 20. Specifically, the gate drive circuit 10d includes the comparator 21, the switching circuit 22d, a buffer 14, the buffer 23, the transistor MN1, the register 123, and the D/A converter 124. The comparator 21 is also used as the gate voltage monitor circuit 15. The switching circuit 22d is also used as the logic circuit 13. The register 123 and the DA converter 124 are used as a setting circuit for setting the level of the reference voltage Vr. The level of the reference voltage Vr is adjustable.

Switching circuit 22d is a modified example of the switch switching circuit 22, for example, has an SR latch circuit 221 and a logic product circuit 222. In the SR latch circuit 221, the control signal IN from the control circuit 17 is input to an reset terminal R, the comparison result Vcmp of the comparator 21 is input to a set terminal S, and the control signal AMC is output from an output terminal Q. In this example, when the set and reset of the SR latch circuit 221 are input at the same time, the reset is prioritized. The logic product circuit 222 outputs a control signal AMC, an inverted signal of the comparison result of the comparator 21, the logical product of as the error signal ERR2.

Figure 11:
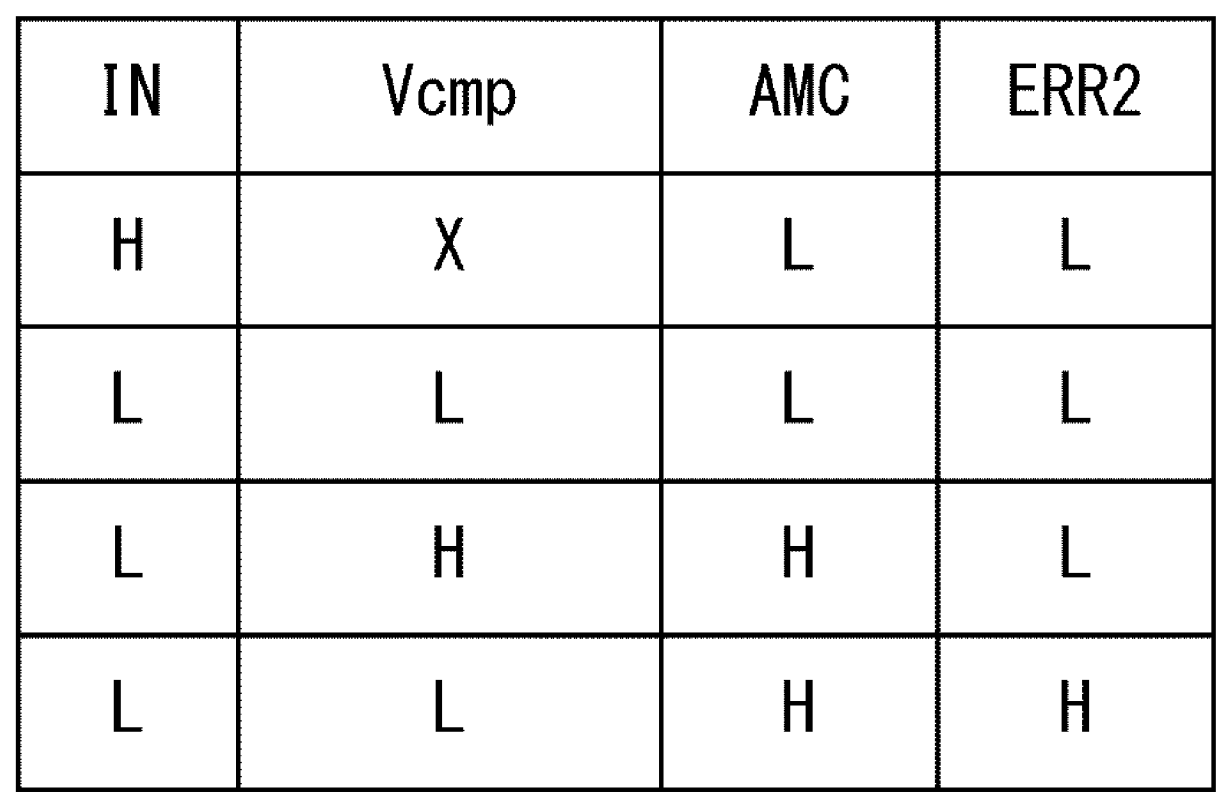
Figure 12:
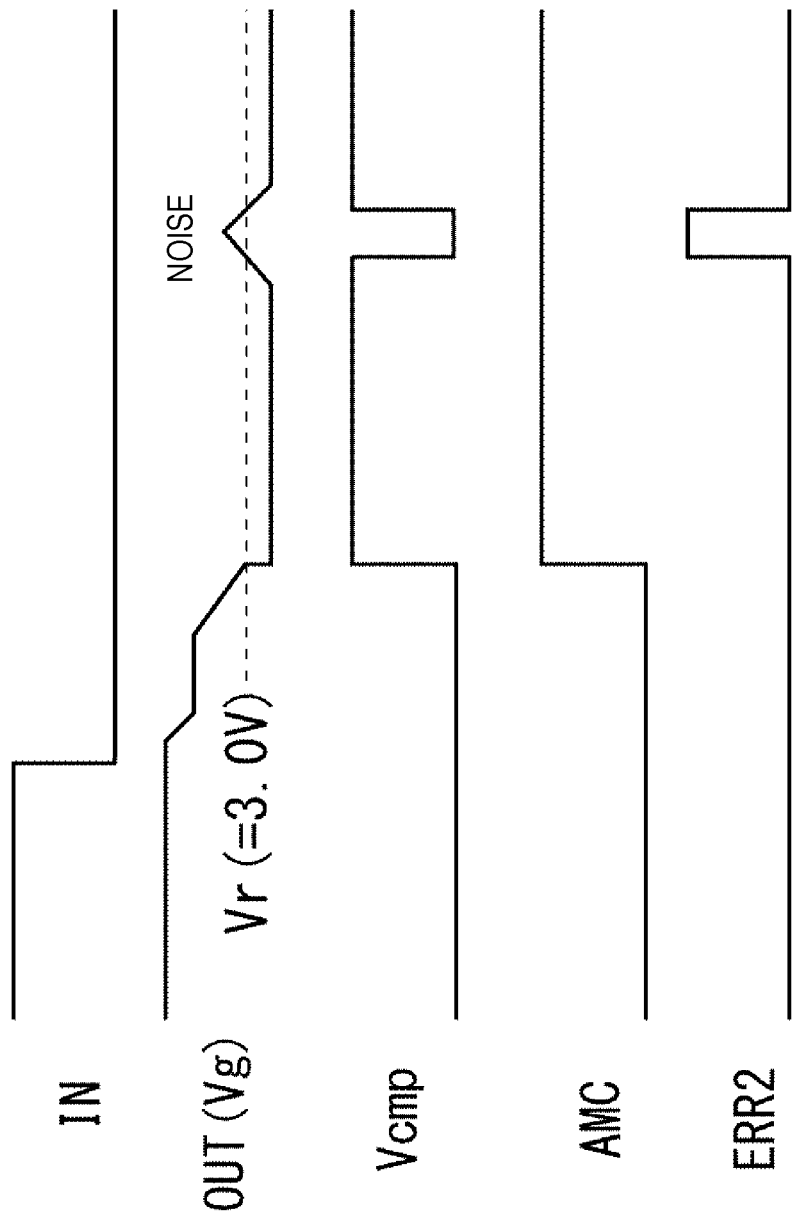
FIG. 12 is a timing chart showing an operation of the gate drive circuit provided in the power supply system shown in FIG. 10.

FIG. 11 is a truth table of an input and an output signal of the gate drive circuit 10d. FIG. 12 is a timing chart showing an operation of the gate drive circuit 10d. As shown in FIGS. 11 and 12, when the control signal IN outputted from the control circuit 17 is at the H level, the control signal AMC indicates the L level and the error signal ERR2 indicates the L level regardless of the comparison result Vcmp. Thereafter, when the control signal IN is switched from the H level to the L level, a voltage of a control signal OUT, i.e., the gate voltage Vg, is lowered in accordance with the change. However, during the period in which the voltage Vg of the control signal OUT is equal to or higher than the reference voltage Vr, e.g., 3V, the comparison result Vcmp indicates the L level. At this time, the control signal AMC indicates the L level, and the error signal ERR2 indicates the L level indicating that no error has occurred.

Since the control signal AMC indicates L-level, the transistor MN1 is turned off. Thereafter, when the voltage Vg of the control signal OUT becomes less than the reference voltage Vr, the comparison result Vcmp is switched from the L level to the H level. As a result, the control signal AMC is switched from the L level to the H level. The error signal ERR2 keeps the L level.

Since the control signal AMC indicates the H level, the transistor MN1 is turned on. Thereafter, when the voltage Vg of the control signal OUT temporarily becomes equal to or higher than the reference voltage Vr due to noise or the like even though the control signal IN indicates the L level, the comparison result Vcmp is temporarily switched to the L level.

At this time, the error signal ERR2 is switched from the L level to the H level indicating that the gate voltage Vg has unintentionally risen. At this time, the control signal AMC keeps the H level. Therefore, the transistor MN1 keeps on state.

The control circuit 17, upon receiving an H-level error signal ERR2, for example, stops the operation of the gate drive circuit 10d, or notifies the user that the power transistor TR1 is not operating properly.

At this time, the control circuit 17 may suppress the degree of increase of noises generated in the gate voltage Vg by, for example, decreasing the switching speed of the power transistor TR1 or adjusting various other parameters.

Prior to the normal operation, for example, by performing switching control of the power transistor TR1 while adjusting the reference voltage Vr, it is possible to observe to what extent the value of the gate voltage Vg including noise components has a margin until the gate voltage Vg reaches the threshold value for switching the power transistor TR1 from off to on. The control circuit 17 can efficiently adjust the switching speed by using the observation result.

For example, the threshold value of the gate voltage Vg at which the power transistor TR1 is switched from the off-state to the on-state is set to 50V. In addition, it is assumed that the gate voltage Vg is allowed to rise up to 2.0V due to the switching operation. In this instance, with the reference voltage Vr set to 2.0V, by increasing the gate drive current as much as possible and increasing the switching speed within a range in which no error is detected, it is possible to automatically search for a parameter setting value capable of suppressing switching losses and preventing erroneous ignition due to the switching operation. When the searching and adjusting of the parameter setting values are completed, the value of the register 123 is rewritten by the control circuit 17, and the reference voltage Vr is returned to the level (e.g., 3V) used in the normal operation.

Thus, the drive device 1c according to the present embodiment and the power supply system SYS1d having the drive device 1c utilizes a comparator provided in the active mirror clamp circuit to realize the gate voltage monitor circuit 15. Thus, the drive device 1c and the power supply system SYS1d having the drive device 1c can suppress an increase in the circuit size.

In the drive device 1 and the power supply system SYS1d including the drive device 1 according to the present embodiment, the active mirror clamp circuit has a function of detecting whether or not a noise is generated at the gate of the power transistor TR1, the noises being likely to cause erroneous ignition. Thus, the drive device 1 and the power supply system SYS1d having the drive device can adjust the switching speed to reduce a noise when a noise that is likely to cause erroneous ignition is detected at the gates of the power transistor TR1, for example. Thereby improves safety.

As described above, the drive device, the power supplying system, and the test method of the drive device according to the first to fifth embodiments are configured to test the anomaly monitor circuit 11 and the gate voltage monitor circuit 15 after adjusting the threshold voltage Vt so that when the operation mode is the test mode, if the anomaly monitor circuit 11 operates normally, the threshold voltage Vt is determined to be abnormal in the state of the stress applied to the power transistor TR1.

As a result, the drive device and the power supplying system according to the above first to fifth embodiments can monitor the state of the stress applied to the power transistor TR1 by using the anomaly monitor circuit 11 and the gate voltage monitor circuit 15, which are highly reliable. The safety of the drive device and the power supplying system can be improved.

Although the invention made by the inventor has been specifically described based on the embodiment, the present invention is not limited to the embodiment already described, and it is needless to say that various modifications can be made without departing from the gist thereof.

In the above first to fifth embodiments, the power transistor TR1 is IGBT, but not limited to IGBT. The power transistor TR1 may be a transistor other than a IGBT such as a MOSFET, for example.

Further, in the above first to fifth embodiments, it has been described as an example when the gate voltage monitor circuit 15 (or a circuit equivalent thereto) is provided, but not limited thereto. Out of the anomaly monitor circuit 11 (or a circuit corresponding thereto) and the gate voltage monitor circuit 15 (or a circuit corresponding thereto), at least only the anomaly monitor circuit 11 is necessary.

For example, in the above-described embodiment according to semiconductor device, the conductivity type (p-type or n-type) of the semiconductor substrate, the semiconducting layer, the diffusion layer (diffusion area), or the like may be inverted. Therefore, in the case where one of the conductivity types of the n-type or the p-type is the first conductivity type and the other conductivity type is the second conductivity type, the first conductivity type can be the p-type and the second conductivity type can be the n-type, or on the contrary, the first conductivity type can be the n-type and the second conductivity type can be the p-type.

What is claimed is:

1. A drive device comprising:
   a sensor configured to detect and output a state of a stress applied to a power transistor as a detection voltage;
   a threshold voltage setting circuit configured to output a threshold voltage;
   an anomaly monitor circuit configured to determine whether the state of the stress applied to the power transistor is abnormal or not by comparing the detection voltage and the threshold voltage; and
   a control circuit configured to fix the power transistor to on or off according to a type of the stress when the anomaly monitor circuit determines the state of the stress is abnormal,
   wherein, when an operation mode is a test mode, the control circuit is further configured to test whether the anomaly monitor circuit determines the state of the stress is abnormal or not by switching a level of the threshold voltage set by the threshold voltage setting circuit so as to determine that a state of the stress applied to the power transistor is abnormal in the normally operating anomaly monitor circuit.

2. The drive device according to claim 1,
   wherein the stress is a voltage applied to the power transistor,
   wherein the anomaly monitor circuit is configured to determine whether a voltage applied to the power transistor is in an overvoltage state by comparing the detected voltage output from the sensor according to a voltage applied to the power transistor with the threshold voltage, and
   wherein the control circuit is configured to forcibly turn on the power transistor when a voltage applied to the power transistor by the anomaly monitor circuit is determined to be in an overvoltage state.

3. The drive device according to claim 2,
   wherein the sensor comprises a first resistive element and a second resistive element arranged in series between a first terminal and a second terminal of the power transistor, and
   wherein the sensor outputs a voltage at a node between the first and the second resistive elements as the detected voltage.

4. The drive device according to claim 1,
   wherein the stress is a current flowing through the power transistor,
   wherein the anomaly monitor circuit is configured to determine whether a current flowing through the power transistor is in an overcurrent state by comparing the detection voltage output from the sensor according to a current flowing through the power transistor with the threshold voltage, and
   wherein the control circuit is configured to forcibly turn off the power transistor when the anomaly monitor circuit determines that a current flowing through the power transistor is in an overcurrent state.

5. The drive device according to claim 4,
wherein the power transistor is a IGBT (Insulated Gate Bipolar Transistor) or a MOSFET (Metal-Oxide-Semiconductor Field Effect Transistor), and
wherein the sensor is configured to output a collector voltage or a drain voltage of the power transistor indicating a voltage value corresponding to a collector current or a drain current of the power transistor as the detected voltage.

6. The drive device according to claim 4,
wherein the power transistor is a multi-emitter type IGBT (Insulated Gate Bipolar Transistor) or a multi-source type MOSFET (Metal-Oxide-Semiconductor Field Effect Transistor), and
wherein the sensor has a resistor for converting a current outputted from a current sense emitter or a current sense source of the power transistor into the detection voltage.

7. The drive device according to claim 1,
wherein the stress is a temperature of the power transistor, and
wherein the anomaly monitor circuit is configured to forcibly turn off the power transistor when the anomaly monitor circuit determines that the temperature of the power transistor is overheated by comparing the detected voltage outputted from the sensor according to the temperature of the power transistor with the threshold voltage.

8. The drive device according to claim 7,
wherein the sensor comprises;
    a constant current source, and
    a diode through which a constant current output from the constant current source flows,
wherein the sensor outputs a forward voltage of the diode as the detected voltage, the forward voltage of the diode varying according to a temperature of the power transistor.

9. The drive device according to claim 1, further comprising a gate voltage monitor circuit configured to monitor a gate voltage of the power transistor.

10. The drive device according to claim 9, wherein the gate voltage monitor circuit is configured to directly monitor the gate voltage of the power transistor.

11. The drive device according to claim 9,
wherein the control circuit is configured to fix the gate voltage of the power transistor to a predetermined voltage according to the type of stress when the anomaly monitor circuit determines that the state of the stress is abnormal, and
wherein the control circuit is configured to test whether the gate voltage monitor circuit determines the gate voltage is fixed to the predetermined voltage when an operation mode is a test mode.

12. The drive device according to claim 9, wherein the gate voltage monitor circuit comprise a comparator configured to compare a gate voltage of the power transistor with a reference voltage.

13. The drive device according to claim 9, further comprising:
an active mirror clamp circuit configured to clamp the gate voltage to a ground level in response to a decrease in the gate voltage of the power transistor below a boundary value of on/off switching of the power transistor;
wherein the active mirror clamp circuit comprises:
    a switch element provided between a gate of the power transistor and a ground voltage terminal;
    a comparator configured to compare the gate voltage with a reference voltage lower than the boundary value; and
    a switching circuit configured to control the switch element to be on when the gate voltage is determined to be less than the reference voltage by the comparator,
wherein the comparator provided in the active mirror clamp circuit is also used as the gate voltage monitor circuit.

14. The drive device according to claim 9,
wherein the active mirror clamp circuit is configured to keep the switch element on when the switch element is controlled on until control of the power transistor from off to on is initiated by the control circuit.

15. The drive device according to claim 13,
wherein the comparator outputs a comparative result indicating a noise generation in the gate of the power transistor when the gate voltage of the power transistor is equal to or higher than the reference voltage even though the power transistor is controlled to be turned off by the control circuit.

16. The drive device according to claim 15,
wherein the control circuit is configured to be able to switch a level of the reference voltage.

17. The drive device according to claim 16,
wherein the control circuit is configured to adjust the reference voltage to be a maximum value permitted as an increase in the gate voltage due to the noise when an operation mode is a test mode, and then adjust an on-off switching speed of the power transistor within a range in which the gate voltage indicates a maximum value less than the reference voltage.

18. A power delivery system comprising;
a drive device comprising:
    a sensor configured to detect and output a state of a stress applied to a power transistor as a detection voltage;
    a threshold voltage setting circuit configured to output a threshold voltage;
    an anomaly monitor circuit configured to determine whether the state of the stress applied to the power transistor is abnormal or not by comparing the detection voltage and the threshold voltage; and
    a control circuit configured to fix the power transistor to on or off according to a type of the stress when the anomaly monitor circuit determines the state of the stress is abnormal,
    wherein, when an operation mode is a test mode, the control circuit is further configured to test whether the anomaly monitor circuit determines the state of the stress is abnormal or not by switching a level of the threshold voltage set by the threshold voltage setting circuit so that the anomaly monitor circuit operating normally determines the state of the stress is abnormal, and
a power transistor.

19. A method of testing a drive device comprising:
switching a level of a threshold voltage set by a threshold voltage setting circuit so as to determine that a state of a stress applied to a power transistor is abnormal in a normally operating anomaly monitor circuit, and testing whether the anomaly monitor circuit determines the state of the stress applied to the power transistor is abnormal by comparing a detected voltage of a sensor for detecting a state of a stress applied to the power transistor with the threshold voltage.

* * * * *